United States Patent
Lou et al.

(10) Patent No.: US 12,279,500 B2
(45) Date of Patent: Apr. 15, 2025

(54) DISPLAY PANEL AND DISPLAY APPARATUS

(71) Applicant: YUNGU (GU'AN) TECHNOLOGY CO., LTD., Hebei (CN)

(72) Inventors: Zhenhua Lou, Langfang (CN); Xiaokang Zhou, Langfang (CN); Qiqi Qin, Langfang (CN); Xiaocong Li, Langfang (CN); Jin Xu, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 576 days.

(21) Appl. No.: 17/834,157

(22) Filed: Jun. 7, 2022

(65) Prior Publication Data
US 2022/0302415 A1     Sep. 22, 2022

Related U.S. Application Data (63) Continuation of application No. PCT/CN2021/090596, filed on Apr. 28, 2021.

(30) Foreign Application Priority Data

Jun. 22, 2020 (CN) .......................... 202010573884.5

(51) Int. Cl.
*H10K 59/35*     (2023.01)
*H10K 50/844*     (2023.01)
(Continued)

(52) U.S. Cl.
CPC ........... *H10K 59/35* (2023.02); *H10K 59/879* (2023.02); *H10K 59/8731* (2023.02);
(Continued)

(58) Field of Classification Search
CPC ............. H10K 59/8791; H10K 59/879; H10K 59/875; H10K 59/8731
See application file for complete search history.

(56) References Cited

U.S. PATENT DOCUMENTS

2016/0093828 A1*   3/2016   Kim .................... H10K 50/844
                                                                                257/40
2017/0357125 A1   12/2017   Tojo
(Continued)

FOREIGN PATENT DOCUMENTS

CN        106257682 A    12/2016
CN        106654045 A     5/2017
(Continued)

OTHER PUBLICATIONS

International Search Report (with English Translation) and International Written Opinion of the International Searching Authority mailed Jul. 21, 2021, in corresponding to International Application No. PCT/CN2021/090596; 13 pages.
(Continued)

*Primary Examiner* — Mariceli Santiago
(74) *Attorney, Agent, or Firm* — Maier & Maier, PLLC (57) ABSTRACT

A display panel and a display apparatus. The display panel includes: a substrate; a light-emitting element disposed on the substrate; an encapsulation layer on a side of the light-emitting element away from the substrate, where the encapsulation layer includes a first inorganic film layer, a first auxiliary film layer and an organic film layer stacked on the light-emitting element, an absolute value of a difference between a refractive index of the first inorganic film layer and a refractive index of the first auxiliary film layer is less than or equal to 0.05, and an extinction coefficient of the first auxiliary film layer for visible light is less than an extinction coefficient of the first inorganic film layer for visible light.

20 Claims, 6 Drawing Sheets

(51) Int. Cl.
   *H10K 50/858* (2023.01)
   *H10K 59/80* (2023.01)
   *H10K 102/00* (2023.01)
(52) U.S. Cl.
   CPC ....... *H10K 59/877* (2023.02); *H10K 59/8791* (2023.02); *H10K 2102/331* (2023.02)

(56) References Cited

U.S. PATENT DOCUMENTS

2019/0043931 A1  2/2019  Yim et al.
2019/0237704 A1* 8/2019  Moon .................... H10K 59/40

FOREIGN PATENT DOCUMENTS

| CN | 106816462 A | 6/2017 |
|---|---|---|
| CN | 107046051 A | 8/2017 |
| CN | 107085337 A | 8/2017 |
| CN | 107565055 A | 1/2018 |
| CN | 108511614 A | 9/2018 |
| CN | 108807716 A | 11/2018 |
| CN | 108899438 A | 11/2018 |
| CN | 109285958 A | 1/2019 |
| CN | 109830515 A | 5/2019 |
| CN | 208889704 U | 5/2019 |
| CN | 110379934 A | 10/2019 |
| CN | 110473981 A | 11/2019 |
| CN | 110581228 A | 12/2019 |
| CN | 111244145 A | 6/2020 |
| CN | 111697160 A | 9/2020 |
| CN | 118301999 A * | 7/2024 |
| EP | 1515369 A2 | 3/2005 |
| WO | 2006093749 A3 | 5/2007 |

OTHER PUBLICATIONS

The First Office Action issued May 7, 2022, corresponding to Chinese Application No. 202010573884.5, 11 pages (with English Translation).

* cited by examiner

DISPLAY PANEL AND DISPLAY APPARATUS

CROSS-REFERENCE TO RELATED APPLICATIONS

This application is a continuation of International Application No. PCT/CN2021/090596, filed on Apr. 28, 2021, which claims priority to Chinese Patent Application No. 202010573884.5, filed on Jun. 22, 2020, both of which are hereby incorporated by reference in their entireties.

TECHNICAL FIELD

The present application relates to the field of display, and particularly relates to a display panel and a display apparatus.

BACKGROUND

An organic light emitting diode (OLED) display panel has the advantages of high color gamut, flexibility and fast response, and its market share increases year by year. Users are increasingly demanding on the display effect of the OLED display panel. However, since the thickness of various film layers in the device and package fluctuates continuously with the evaporation cycles, the non-uniformity of film thickness in the OLED display panel will aggravate the discreteness of viewing angle characteristics of the OLED display panel, causing the OLED display panel to have problems such as cyan tint displaying and pink tint displaying in certain viewing angles.

Therefore, there is an urgent need for a new display panel and a new display apparatus.

SUMMARY

Embodiments of the present application provide a display panel and a display apparatus, in order to improve the display effect of the display panel.

A first aspect of the embodiments of the present application provides a display panel including: a substrate; a light-emitting element, disposed on the substrate; an encapsulation layer on a side of the light-emitting element away from the substrate, where the encapsulation layer includes a first inorganic film layer, a first auxiliary film layer and an organic film layer that are stacked on the light-emitting element, an absolute value of a difference between a refractive index of the first inorganic film layer and a refractive index of the first auxiliary film layer is less than or equal to 0.05, and an extinction coefficient of the first auxiliary film layer for visible light is less than an extinction coefficient of the first inorganic film layer for visible light.

A second aspect of the embodiments of the present application provides a display apparatus including the display panel according to any one of the above implementations.

In the display panel according to the embodiments of the present application, the display panel includes the substrate, the light-emitting element disposed on the substrate, and the encapsulation layer configured to encapsulate the light-emitting element. The encapsulation layer can prevent penetration of water and oxygen and improve the service life of the light-emitting element. The encapsulation layer includes the first inorganic film layer, the first auxiliary film layer and the organic film layer. The absolute value of the difference between the refractive indices of the first inorganic film layer and the first auxiliary film layer is less than or equal to 0.05. That is, the refractive indices of the first inorganic film layer and the first auxiliary film layer are close, so that the light reflected by the contact interface between the first inorganic film layer and the first auxiliary film layer can be reduced. Thus, the thickness of the first inorganic film layer no longer has a great influence on the viewing angle characteristics, which mitigates the color shift between viewing angles or uneven color rendering caused by the uneven thickness of the first inorganic film layer, and improves the display effect of the display panel. In addition, the extinction coefficient of the first auxiliary film layer for visible light is less than the extinction coefficient of the first inorganic film layer for visible light, which can reduce the influence of the additional first auxiliary film layer on the light output of the display panel. Therefore, the embodiments of the present application can improve the display effect of the display panel on the premise of ensuring enough light output of the display panel.

DETAILED DESCRIPTION

Reference will now be made in detail to the features and exemplary embodiments of the various aspects of the present application, and in order that the objects, aspects and advantages of the present application will become more apparent, a more particular description of the present application will be rendered by reference to specific embodiments thereof which are illustrated in the appended drawings. It should be understood that the specific embodiments described herein are to be construed as merely illustrative, and not limitative of the remainder of the disclosure. It will be apparent to one skilled in the art that the present application may be practiced without some of these specific details. The following description of the embodiments is merely provided to provide a better understanding of the application by illustrating examples of the invention.

An organic light emitting diode (OLED) display panel 100 has the advantages of high color gamut, flexibility and fast response, and its market share increases year by year. Users are increasingly demanding on the display effect of the OLED panel.

In the OLED display panel, the thickness of various film layers in the light-emitting device layer and the encapsulation layer is non-uniform. Especially, when the thickness of various film layers in the encapsulation layer is non-uniform, the discreteness of the viewing angle characteristics of the OLED display panel will be aggravated, causing the OLED display panel to have problems such as cyan and pink viewing angles. In the actual manufacturing process of the OLED display panel, although the yield loss can be recovered to a certain extent by improving the uniformity of the film layers and monitoring the chromaticity, the discreteness still cannot be fundamentally solved.

Figure 1:
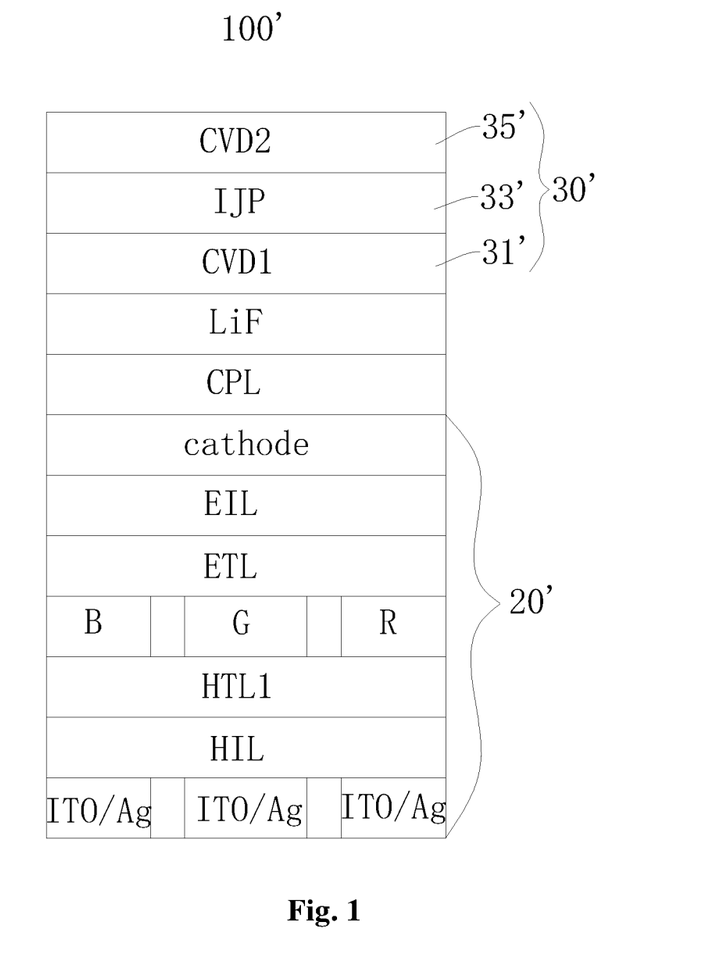
FIG. 1 illustrates a partial cross-sectional view of a display panel.

With reference to FIG. 1, an OLED display panel 100' includes a light-emitting element 20' and an encapsulation layer 30' on the light-emitting element 20'. The encapsulation layer 30' includes a first inorganic film layer 31', an organic film layer 33' and a second inorganic film layer 35' that are sequentially stacked. A contact interface between the first inorganic film layer 31' and the organic film layer 33' can reflect light emitted by the light-emitting element 20'. When the first inorganic film layer 31' is not uniform in thickness, the light reflected by the contact interface between the first inorganic film layer 31' and the organic film layer 33' is not uniform. Thus, fluctuations in the thickness of the first inorganic layer in the encapsulation layer 30' on the light-emitting device 22' in the display panel 100' have a significant influence on trajectory of white light as well as the color shift between viewing angles. This leads to an increased probability of occurrence of pink tint displaying in a small viewing angle and cyan tint displaying in a large viewing angle and causes yield loss. Therefore, it is necessary to improve the display panel 100' to reduce the sensitivity of the viewing angle characteristics to the thickness of film layer.

Embodiments of the present application provide a display panel that may be an organic light emitting diode (OLED) display panel.

Figure 2:
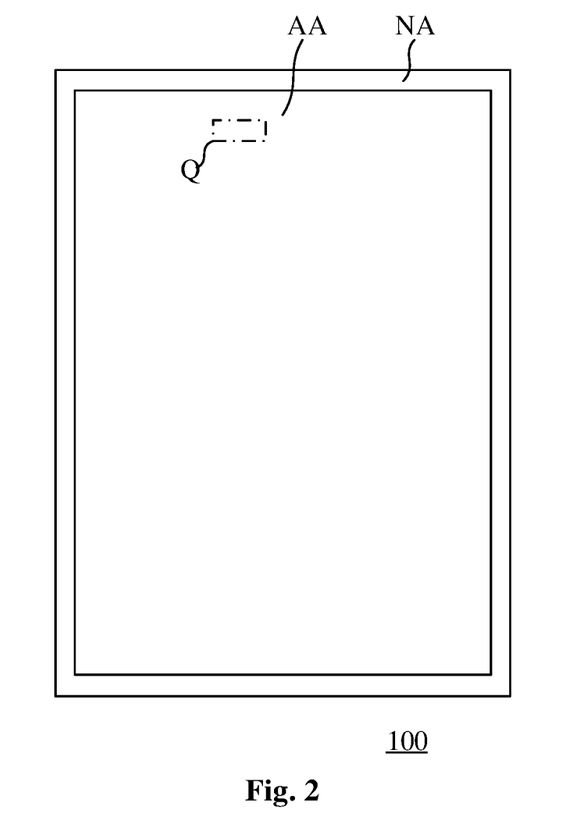
FIG. 2 illustrates a schematic top view of a display panel according to an embodiment of the present application.
Figure 3:
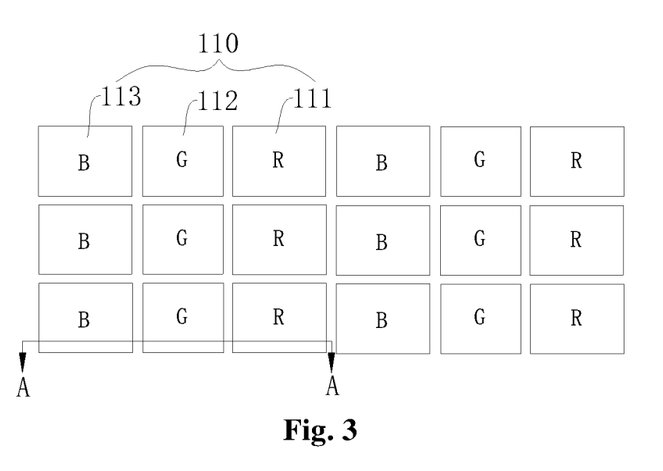
FIG. 3 illustrates an enlarged partial view of an example of the region Q shown in FIG. 2.

With reference to FIG. 2 and FIG. 3, a display panel 100 according to an embodiment of the present application includes a display area AA and a non-display area NA. In other embodiments, the display panel 100 may be a full-screen display panel 100 including the display area AA.

The display panel 100 includes a plurality of sub-pixels 110, for example a red sub-pixel 111, a blue sub-pixel 113 and a green sub-pixel 112. In other embodiments, the plurality of sub-pixels 110 may include a yellow sub-pixel, for example.

Figure 4:
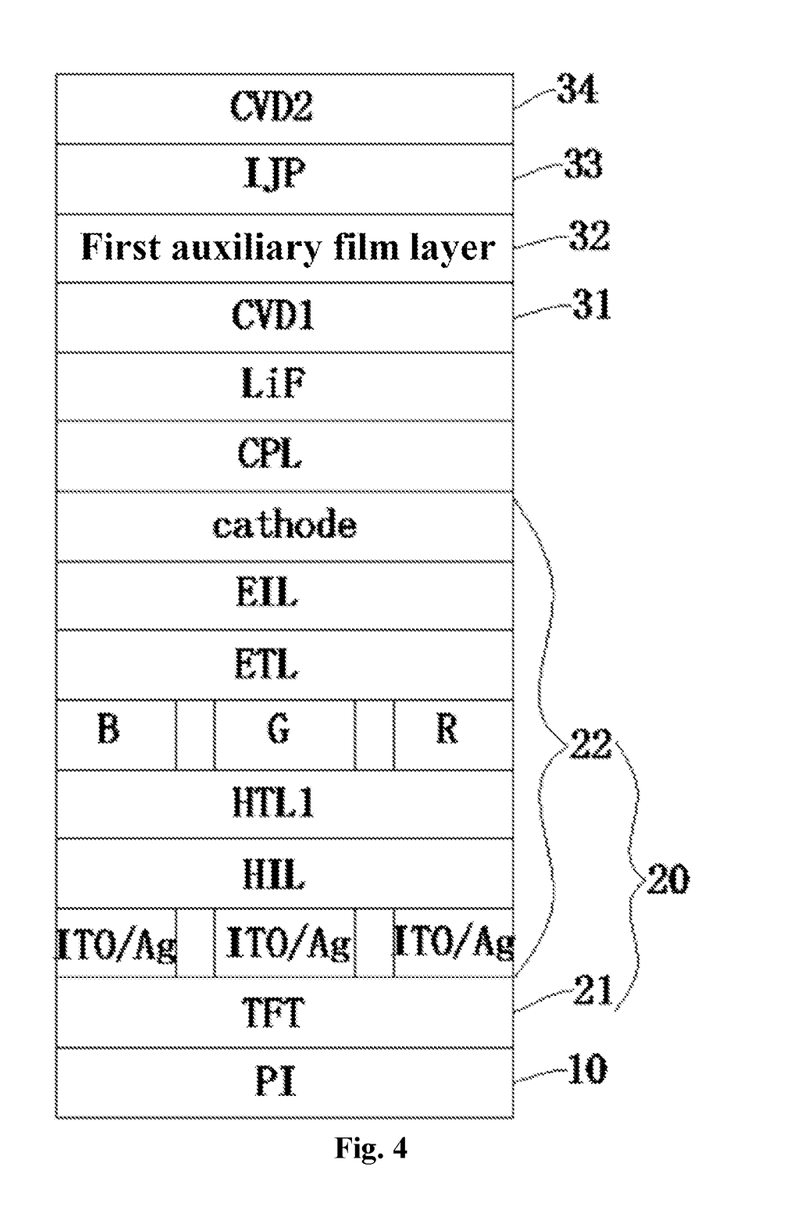
FIG. 4 illustrates a cross-sectional view along line A-A shown in FIG. 3 according to an embodiment.

With reference to FIG. 4, the display panel 100 includes a substrate 10, a light-emitting element 20 on the substrate 10, and an encapsulation layer 30 on a side of the light-emitting element 20 away from the substrate 10. The encapsulation layer 30 includes a first inorganic film layer 31, a first auxiliary film layer 32 and an organic film layer 33 that are sequentially stacked on the light-emitting element 20. An absolute value of a difference between a refractive index of the first inorganic film layer 31 and a refractive index of the first auxiliary film layer 32 is less than or equal to 0.05. An extinction coefficient of the first auxiliary film layer 32 for visible light is less than an extinction coefficient of the first inorganic film layer 31 for visible light.

The encapsulation layer 30 is configured to encapsulate the light-emitting element 20, and can prevent penetration of water and oxygen and improve the service life of the light-emitting element 20. The absolute value of the difference between the refractive indices of the first inorganic film layer 31 and the first auxiliary film layer 32 being less than or equal to 0.05 means that the refractive indices of the first inorganic film layer 31 and the first auxiliary film layer 32 are close and the light reflected by the contact interface between the first inorganic film layer 31 and the first auxiliary film layer 32 can be reduced. Thus, the thickness of the first inorganic film layer 31 no longer has a great influence on the viewing angle characteristics, and the color shift between viewing angles or color rendering unevenness caused by the uneven thickness of the first inorganic film layer 31 is mitigated, thereby improving the display effect of the display panel 100.

In addition, since the extinction coefficient of the first auxiliary film layer 32 for visible light is less than the extinction coefficient of the first inorganic film layer 31 for visible light, the influence of the additional first auxiliary film layer 32 on the light output of the display panel 100 can be reduced. Therefore, the embodiments of the present application can improve the display effect of the display panel 100 on the premise of ensuring enough light output of the display panel 100.

Extinction coefficient refers to the amount of light absorbed by an object to be tested (e.g., the first inorganic film layer 31). The extinction coefficient characterizes the capability of the object to be tested to absorb light. The greater the extinction coefficient, the greater the capability of the object to be tested to absorb light, and the less the amount of light emitted through the object to be tested. On the contrary, the smaller the extinction coefficient is, the weaker the capability of the object to be tested to absorb light, and the more the amount of light emitted through the object to be tested.

Optionally, in some embodiments, a light extraction layer and a light modulation layer are disposed between the light-emitting element 20 and the encapsulation layer 30. The light modulation layer may for example be a lithium fluoride layer, to improve the light extraction efficiency of the display panel 100.

The substrate 10 may be made of a light-transmitting material such as glass, polyimide (PI), etc. The light-emitting element 20 includes, for example, a driving device and a light-emitting device. The driving device may for example include a pixel driving circuit. The light-emitting device includes, for example, a first electrode layer, a light-emitting structure layer, and a second electrode layer.

In some embodiments, the light-emitting structure layer may further include at least one of a hole injection layer, a hole transport layer, an electron injection layer, or an electron transport layer, depending on design requirements.

The first electrode layer may be a light-transmitting electrode, and the first electrode layer may include an indium tin oxide (ITO) layer or an indium zinc oxide layer. Alternatively, the first electrode layer may be a reflective electrode layer, including a first light-transmitting conductive layer, a reflective layer on the first light-transmitting conductive layer, and a second light-transmitting conductive layer on the reflective layer. The first light-transmitting conductive layer and the second light-transmitting conductive layer may be ITO, indium zinc oxide, etc. The reflective layer may be a metal layer, for example made of a silver material. The second electrode layer may include a magnesium-silver alloy layer.

For example, the display panel 100 may further include a polarizer and a cover plate disposed over the encapsulation layer 30, or the cover plate may be disposed directly over the encapsulation layer 30 without the polarizer. In some optional embodiments, a touch electrode may be disposed over encapsulation layer 30.

Optionally, the refractive index of the first auxiliary film layer 32 is less than or equal to the refractive index of the first inorganic film layer 31.

In some embodiments, the first auxiliary film layer 32 has a refractive index of 1.7-1.8. Optionally, the refractive index of the first auxiliary film layer 32 is equal to the refractive index of the first inorganic film layer 31.

In these optional embodiments, the refractive index of the first auxiliary film layer 32 and the refractive index of the first inorganic film layer 31 are equal, which can reduce the reflected light generated when the light of the light-emitting element 20 passes through the contact interface between the first auxiliary film layer 32 and the first inorganic film layer 31, mitigate the color shift between viewing angles or color rendering unevenness of the display panel 100 due to the uneven thickness of the first inorganic film layer 31, and further improve the display effect of the display panel 100.

In some embodiments, the first auxiliary film layer 32 and the first inorganic film layer 31 each have a refractive index of 1.75. According to the experimental measurement, when the refractive indices of the first auxiliary film layer 32 and the first inorganic film layer 31 are both 1.75, it can ensure that the first inorganic film layer 31 has a good protective effect and avoids the invasion of water and oxygen, and can also ensure that the first inorganic film layer 31 has a good bending performance and improve the bending performance of the display panel 100. The first auxiliary film layer 32 and the first inorganic film layer 31 both have a refractive index of 1.75, which can mitigate the color shift between viewing angles or color rendering unevenness of the display panel 100 due to the uneven thickness of the first inorganic film layer 31, and further improve the display effect of the display panel 100.

In some optional embodiments, the first inorganic film layer 31 has an extinction coefficient for visible light ranging from 0.0006 to 0.0110, and the first auxiliary film layer 32 has an extinction coefficient for visible light ranging from 0.00002 to 0.0010. In these embodiments, when the extinction coefficients of the first inorganic film layer 31 and the first auxiliary film layer 32 are within the above ranges, enough light output of the display panel 100 can be ensured, thereby improving the display effect of the display panel 100.

In some embodiments, the first inorganic film layer 31 has an extinction coefficient for red light in a range of 0.0006 to 0.0018, and the first auxiliary film layer 32 has an extinction coefficient for red light in a range of 0.00002 to 0.00006. In these embodiments, the first auxiliary film layer 32 has a relatively low extinction coefficient for red light, which ensures enough light output of the display panel 100 for red light.

In some embodiments, the first inorganic film layer 31 has an extinction coefficient for green light in a range of 0.002 to 0.0037, and first auxiliary film layer 32 has an extinction coefficient for green light in a range of 0.00003 to 0.00008. In these optional embodiments, the first auxiliary film layer 32 has a relatively low extinction coefficient for green light, which ensures enough light output of the display panel 100 for green light.

In some embodiments, the first inorganic film layer 31 has an extinction coefficient for blue light in a range from 0.0039 to 0.0059, and first auxiliary film layer 32 has an extinction coefficient for blue light (light having a wavelength ranging from 492 nm to 455 nm) in a range from 0.002 to 0.001. In these embodiments, the first auxiliary film layer 32 has a relatively low extinction coefficient for blue light, which ensures enough light output of the display panel 100 for blue light.

The organic film layer 33 may be formed by various processes, and the organic film layer 33 may be formed by, for example, ink-jet printing.

Figure 5:
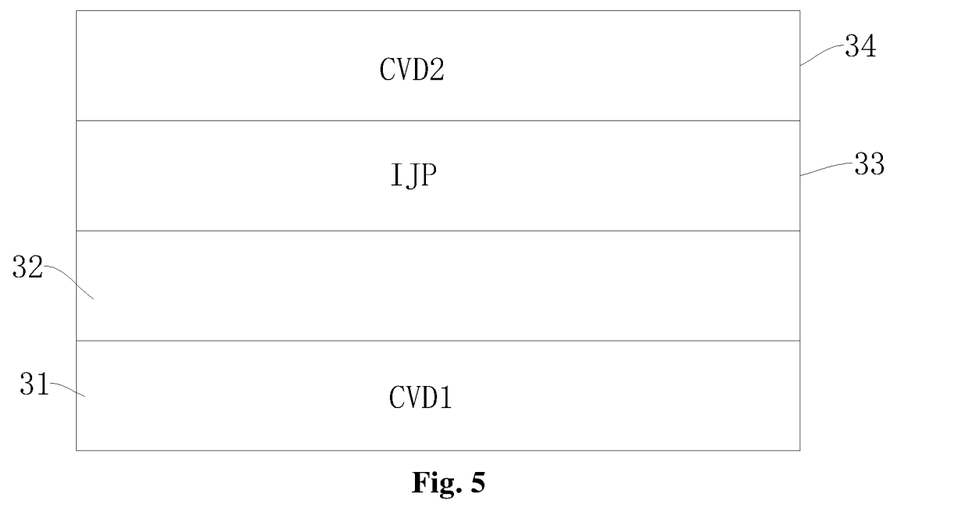
FIG. 5 illustrates a schematic structural diagram of an encapsulation layer of a display panel according to an embodiment.

With reference to FIG. 5, the first auxiliary film layer 32 may be arranged in various manners. For example, the first auxiliary film layer 32 may formed by laying the whole layer. The first auxiliary film layer 32 may be formed by laying an organic material, that is, the first auxiliary film layer 32 is an organic material-made auxiliary film layer. The first auxiliary film layer 32 is made of an organic material, so that the first auxiliary film layer 32 may be made by a same process as the organic film layer 33. In the forming process of the display panel 100, after the first auxiliary film layer 32 is formed, the organic film layer 33 can be continuously formed without moving and replacing the ink-jet printing apparatus, which can simplify the process flow and improve the forming efficiency of the display panel 100.

Optionally, the first auxiliary film layer 32 and the organic film layer 33 have the same composition. This allows the organic film layer 33 to be sequentially formed after the first auxiliary film layer 32 has been formed by simply changing the parameters of the inkjet printing apparatus.

In some embodiments, the thickness of the first auxiliary film layer 32 ranges from 1 μm to 10 μm. It has been experimentally determined that when the thickness of the first auxiliary film layer 32 is within the above thickness range, the light reflection between the first inorganic film layer 31 and the first auxiliary film layer 32 can be well improved without affecting other properties of the display panel 100.

Optionally, the thickness of the first auxiliary film layer 32 is 2 μm.

In some optional embodiments, the material of the first auxiliary film layer 32 includes one or more of a semi-alicyclic polyimide, a phenylquinoxaline-based polymer, a methallyl-type mercapto ester group-containing monomer, a poly (2-methallyl benzothiazole mercapto ester), and a siloxane compound.

Figure 6:
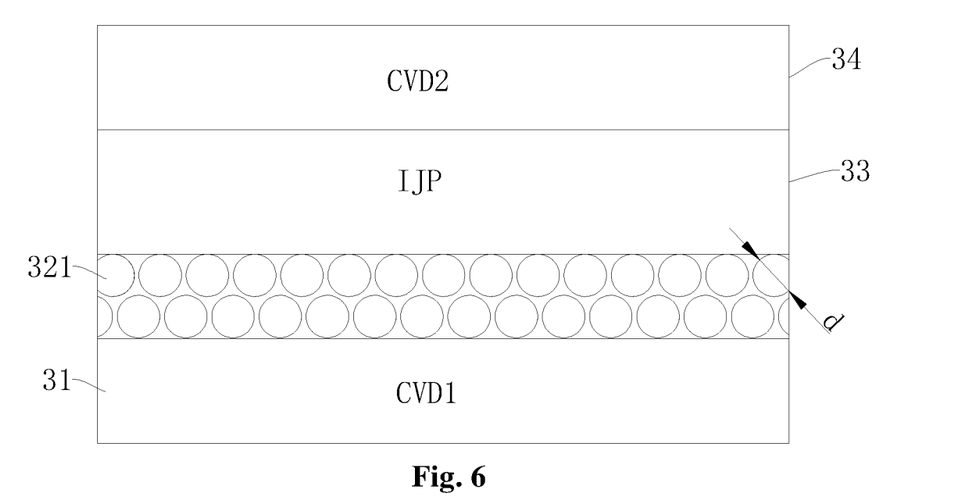
FIG. 6 illustrates a schematic structural diagram of an encapsulation layer of a display panel according to another embodiment.

With further reference to FIG. 6, in some embodiments, the first auxiliary film layer 32 is a nanoparticle layer, and the first auxiliary film layer 32 includes a plurality of nanoparticles 321. In these embodiments, the first auxiliary film layer 32 includes a plurality of nanoparticles 321, which may reflect light emitted by the lighting unit 20. In addition, since the nanoparticles 321 are generally spherical, the light rays reflected by the nanoparticles 321 exit in different directions, and thus the reflected light rays of the nanoparticles 321 do not overlap one another, thereby mitigating the color shift between viewing angles or uneven color rendering of the display panel 100 due to the uneven thickness of the first inorganic film layer 31, and improving the display effect of the display panel 100.

In some optional embodiments, a diameter d of the nanoparticle 321 is in a range of 0.1 μm and 10 μm.

In some embodiments, in a thickness direction of the display panel 100, the an area of orthographic projections of the plurality of nanoparticles 321 in the nanoparticle layer is greater than or equal to 50% of an area of orthographic projection of the first inorganic film layer 31.

In these embodiments, the area of the orthographic projections of the nanoparticles 321 is greater than or equal to 50% of the area of the orthographic projection of the first inorganic film layer 31, which can ensure that sufficient nanoparticles 321 are covered on the first inorganic film layer 31, and ensure that the light reflected by the nanoparticles 321 is sufficient, thereby better mitigating the color shift between viewing angles or uneven color rendering of the display panel 100 due to uneven thickness of the first inorganic film layer 31, and improving the display effect of the display panel 100.

In some embodiments, the nanoparticles 321 are uniformly distributed on the first inorganic film layer 31. In these embodiments, it can be ensured that the reflected light formed by the nanoparticles 321 is dispersed at different positions on the first inorganic film layer 31, further improving the display effect of the display panel 100.

The uniform distribution of the nanoparticles 321 on the first inorganic film layer 31 is not strictly uniform in a mathematical sense, but within an error range. The nanoparticles 321 are uniformly distributed on the first inorganic film layer 31 as long as the reflected light formed by the reflection of the nanoparticles 321 is sufficiently dispersed.

In some embodiments, the nanoparticle layer has a thickness less than or equal to 2d. In these optional embodiments, the thickness of the nanoparticles 321 is less than or equal to 2d. That is, one nanoparticle layer or two nanoparticle layers are laid on the first inorganic film layer 31, which can ensure that the nanoparticle layer can mitigate the color shift between viewing angles or color rendering unevenness of the display panel 100 due to the uneven thickness of the first inorganic film layer 31, and can also reduce the process difficulty and save the manufacturing time of the display panel 100.

In some embodiments, the material of the nanoparticles 321 includes one or both of zinc oxide (ZnO) and titanium dioxide (TiO2).

In some embodiments, the display panel further includes a combined structure layer on a side of the first auxiliary film layer 32 away from the first inorganic film layer 31. The combined structure layer includes a first structure layer, a second structure layer and a third structure layer that are stacked in the light extraction direction. The refractive indices of the first structure layer, the second structure layer and the third structure layer satisfies the following equation:

$$n_2 = \sqrt{n_1 \times n_3} \quad (1),$$

where $n_1$ is the refractive index of the first structure layer, $n_2$ is the refractive index of the second structure layer, and $n_3$ is the refractive index of the third structure layer.

In these embodiments, when the refractive indices of the first structure layer, the second structure layer and the third structure layer satisfy the above-mentioned relationship, the light transmittance of the combined structure layer formed by combining the first structure layer, the second structure layer and the third structure layer can be effectively increased, the light transmittance of the display panel 100 can be further increased, and the power consumption of the display panel 100 can be improved.

Figure 7:
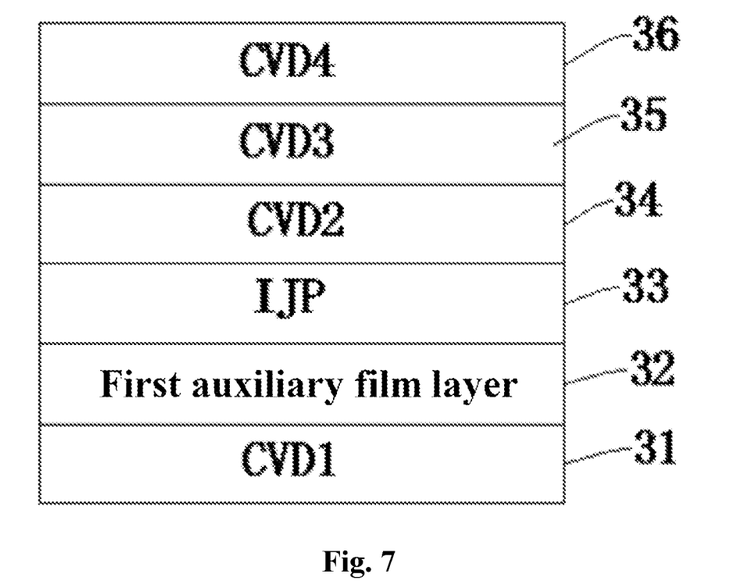
FIG. 7 illustrates a schematic structural diagram of an encapsulation layer of a display panel according to yet another embodiment.

With reference to FIG. 7, in some embodiments, the display panel 100 further includes a second inorganic film layer 34 and a third inorganic film layer 35 on the side of the organic film layer 33 away from the first auxiliary film layer 32. The refractive index of the second inorganic film layer 34 is greater than the refractive index of the organic film layer 33, and the refractive index of the third inorganic film layer 35 is greater than the refractive index of the second inorganic film layer 34.

In these embodiments, a second inorganic film layer 34 is arranged between the organic film layer 33 and the third inorganic film layer 35 and has a refractive index between those of the organic film layer 33 and the third inorganic film layer 35. The refractive index of the second inorganic film layer 34 is closer to the refractive index of the organic film layer 33 than the refractive index of the third inorganic film layer 35, so that the light transmittance of the display panel 100 can be increased and the power consumption of the display panel 100 can be improved. In addition, the light reflected by the contact interface between the organic film layer 33 and the second inorganic film layer 34 and the light reflected by the contact interface between the second inorganic film layer 34 and the third inorganic film layer 35 may interfere with each other, so as to mitigate the color shift between viewing angles or uneven color rendering of the display panel 100 due to uneven thickness of the organic film layer 33, reduce the color shift of the display panel 100 and improve the display effect of the display panel 100.

Optionally, the combined structure layer is provided in the encapsulation layer 30, and the first structure layer is the organic film layer 33, the second structure layer is the second inorganic film layer 34, and the third structure layer is the third inorganic film layer 35. That is, the refractive indexes of the organic film layer 33, the second inorganic film layer 34 and the third inorganic film layer 35 satisfy the following equation:

$$n_{w2} = \sqrt{n_y \times n_{w3}} \quad (2),$$

where $n_{w2}$ is the refractive index of the second inorganic film layer 34, $n_y$ is the refractive index of the organic film layer 33, and $n_{w3}$ is the refractive index of the third inorganic film layer 35.

When the refractive indexes of the organic film layer 33, the second inorganic film layer 34 and the third inorganic film layer 35 satisfy the above-mentioned relationship, the light transmittance of the organic film layer 33, the second inorganic film layer 34 and the third inorganic film layer 35 can be effectively increased, the light transmittance of the display panel 100 can be further increased, and the power consumption of the display panel 100 can be improved.

In some embodiments, the second inorganic film layer has a refractive index ranging from 1.60 to 1.70. Optionally, the second inorganic film layer has a refractive index of 1.64. For example, if the organic film layer 33 has a refractive index of 1.5 and the third inorganic film layer 35 has a refractive index of 1.78, then second inorganic film layer 34 may have a refractive index of 1.64.

In some embodiments, the second inorganic film layer 34 has a thickness ranging from 80 nm to 100 nm. Optionally, the second inorganic film layer 34 has a thickness of 90 nm.

Figure 8:
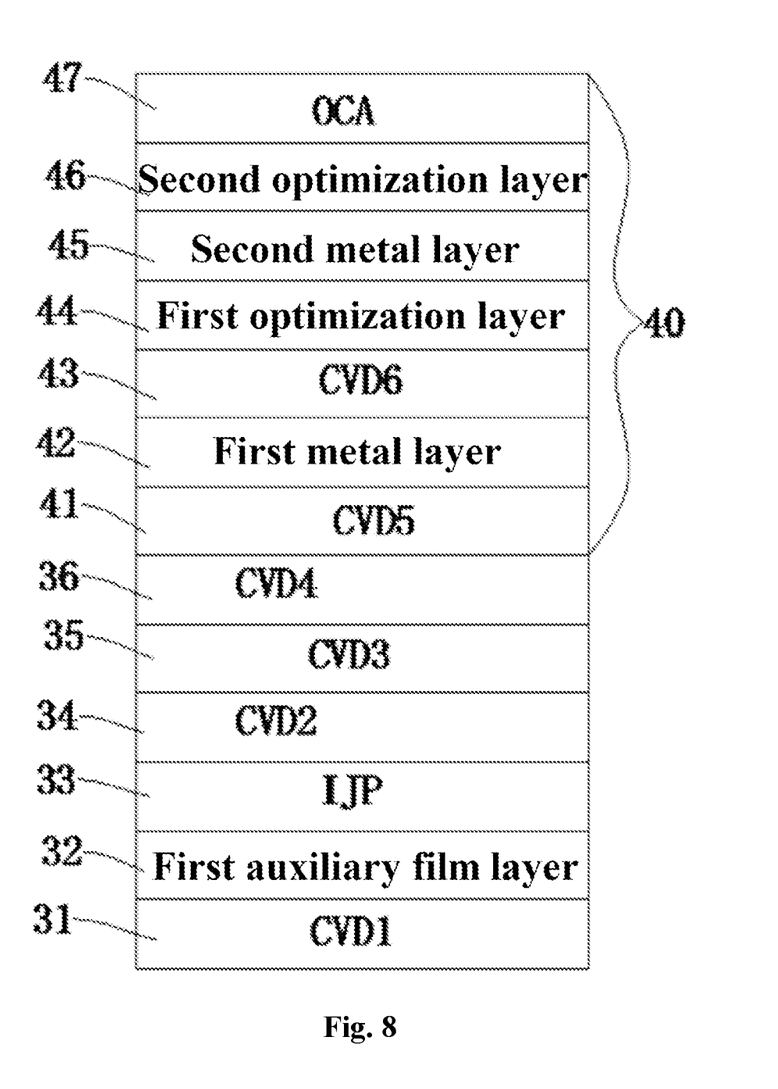
FIG. 8 illustrates a partial cross-sectional view along line A-A shown in FIG. 3 according to another embodiment.

With reference to FIG. 8, in some optional embodiments, the encapsulation layer 30 further includes a fourth inorganic film layer 36 on the side of the third inorganic film layer 35 away from the second auxiliary film layer 34. The fourth inorganic film layer 36 having a refractive index greater than the refractive index of the third inorganic film layer 35. The display panel 100 further includes a touch layer 40 on the side of the encapsulation layer 30 away from the light-emitting element 20. The touch layer 40 includes a fifth inorganic film layer 41, a metal layer and an optical adhesive layer 47 that are stacked sequentially on the side of the encapsulation layer 30 away from the light-emitting element 20. The refractive index of the fourth inorganic film layer 36 is less than the refractive index of the fifth inorganic film layer 41.

In these embodiments, the fourth inorganic film layer 36 is arranged between the third inorganic film layer 35 and the fifth inorganic film layer 41. The refractive index of fourth inorganic film layer 36 is between the refractive index of the third inorganic film layer 35 and the refractive index of the fifth inorganic film layer 41. The refractive index of the fourth inorganic film layer 36 is closer to the refractive index of the third inorganic film layer 35 than the refractive index of the fifth inorganic film layer 41, so that the light transmittance of the display panel 100 can be increased and the power consumption of the display panel 100 can be improved. In addition, the light reflected by the contact interface between the third inorganic film layer 35 and the fourth inorganic film layer 36 and the light reflected by the contact interface between the fourth inorganic film layer 36 and the fifth inorganic film layer 41 may interfere with each other, so that the color shift between viewing angles or uneven color rendering of the display panel 100 due to the uneven thickness of the third inorganic film layer 35 can be mitigated, the color shift of the display panel 100 can be reduced and the display effect of the display panel 100 can be improved.

Optionally, at least a part of the combined structure layer is in the encapsulation layer 30, another part of the combined structure layer is in the touch layer 40, and the first structure layer is the third inorganic film layer 35. The second structure layer is the fourth inorganic film layer 36, and the third structure layer is the fifth inorganic film layer 41. That is, the refractive indices of the third inorganic film layer 35, the fourth inorganic film layer 36 and the fifth inorganic film layer 41 satisfy the following equation:

$$n_{w4} = \sqrt{n_{w3} \times n_{w5}} \qquad (3),$$

where $n_{w4}$ is the refractive index of the fourth inorganic film layer 36, $n_{w3}$ is the refractive index of the third inorganic film layer 35, and $n_{w5}$ is the refractive index of the fifth inorganic film layer 41.

When the refractive indices of the third inorganic film layer 35, the fourth inorganic film layer 36 and the fifth inorganic film layer 41 satisfy the above-mentioned relationship, the light transmittance of the third inorganic film layer 35, the fourth inorganic film layer 36 and the fifth inorganic film layer 41 can be effectively increased, the light transmittance of the display panel 100 can be further increased, and the power consumption of the display panel 100 can be improved.

Optionally, with reference to FIG. 8, there may be two combined structure layers. One of the combined structure layers can be provided in the encapsulation layer. That is, in one of the combined structure layers, the first structure layer is the organic film layer 33, the second structure layer is the second inorganic film layer 34, and the third structure layer is the third inorganic film layer 35. That is, the refractive indices of the organic film layer 33, the second inorganic film layer 34 and the third inorganic film layer 35 satisfy the above-mentioned equation (2).

At least a part of the other combined structure layer is positioned in the encapsulation layer 30, and another part of another combined structure layer is positioned in the touch layer 40. That is, in the another combined structure layer, the first structure layer is the third inorganic film layer 35, the second structure layer is the fourth inorganic film layer 36, and the third structure layer is the fifth inorganic film layer 41. That is, the relationship between the refractive indices of the third inorganic film layer 35, the fourth inorganic film layer 36 and the fifth inorganic film layer 41 satisfies the above-mentioned equation (3).

In some embodiments, the fourth inorganic film layer 36 has a refractive index ranging from 1.80 to 1.90. Optionally, the fourth inorganic film layer 36 has a refractive index of 1.84. For example, the third inorganic film layer 35 has a refractive index of 1.78 and the fifth inorganic film layer 41 has a refractive index of 1.9, then the fourth inorganic film layer 36 may have a refractive index of 1.84.

In some optional embodiments, the fourth inorganic film layer 36 has a thickness ranging from 80 nm to 100 nm. Optionally, the fourth inorganic film layer 36 has a thickness of 90 nm.

In some embodiments, the metal layer includes a first metal layer 42 and a second metal layer 45. A sixth inorganic film layer 43 is provided between the first metal layer 42 and the second metal layer 45. An optimization layer is provided between the sixth inorganic film layer 43 and the optical adhesive layer 47. A refractive index of the optimization layer is less than the refractive index of the sixth inorganic film layer 43 and greater than the refractive index of the optical adhesive layer 47.

In these embodiments, an optimization layer having a refractive index less than that of the sixth inorganic film layer 43 and greater than that of the optical adhesive layer 47 is provided between the sixth inorganic film layer 43 and the optical adhesive layer 47. By providing the optimization layer, the angle of the touch layer 40 where total reflection occurs can be increased, the amount of light in which total reflection occurs can be reduced, thereby increasing the light output and improving the power consumption of the display panel 100.

There may be one optimization layer, which is disposed between the sixth inorganic film layer 43 and the second metal layer 45 or disposed between the second metal layer 45 and the optical adhesive layer 47.

In other embodiments, the optimization layers include a first optimization layer 44 positioned between the sixth inorganic film layer 43 and the second metal layer 45 and a second optimization layer 46 positioned between the second metal layer 45 and the optical adhesive layer 47, the first optimization layer 44 having a refractive index greater than the refractive index of the second optimization layer 46.

In these embodiments, the optimization layers include a first optimization layer 44 and a second optimization layer 46. The refractive indices of the sixth inorganic film layer 43, the first optimization layer 44, the second optimization layer 46 and the optical adhesive layer 47 decrease in the direction from the sixth inorganic film layer 43 to the optical adhesive layer 47, so that the angle of total reflection can be further increased, the amount of total reflection light can be reduced, the light output of the display panel 100 can be increased and the power consumption of the display panel 100 can be improved.

Optionally, the combined structure layer is provided in the touch layer 40. The first structure layer is the sixth inorganic film layer 43, the second structure layer is the second optimization layer 46, and the third structure layer is the optical adhesive layer 47. That is, the refractive indices of the sixth inorganic film layer 43, the second optimization layer 46 and the optical adhesive layer 47 satisfy the following equation:

$$n_{y2} = \sqrt{n_6 \times n_0} \qquad (4),$$

where $n_{y2}$ is the refractive index of the second optimization layer 46, $n_6$ is the refractive index of the sixth inorganic film layer 43, and $n_o$ is the refractive index of the optical adhesive layer 47.

When the refractive indices of the sixth inorganic film layer 43, the second optimization layer 46 and the optical adhesive layer 47 satisfy the above-mentioned relationship, the light transmittance of the sixth inorganic film layer 43, the second optimization layer 46 and the optical adhesive layer 47 can be effectively increased, the light transmittance of the display panel 100 can be further increased, and the power consumption of the display panel 100 can be improved.

Optionally, the combined structure layer is provided in the touch layer 40. The first structure layer is the sixth inorganic film layer 43, the second structure layer is the first optimization layer 44, and the third structure layer is the second optimization layer 46. That is, the refractive indexes of the sixth inorganic film layer 43, the first optimization layer 44 and the second optimization layer 46 satisfy the following equation:

$$n_{y1} = \sqrt{n_6 \times n_{y2}} \qquad (5),$$

where $n_{y1}$ is the refractive index of the first optimization layer 44, $n_{y2}$ is the refractive index of the second optimization layer 46, and $n_6$ is the refractive index of the sixth inorganic film layer 43.

When the refractive indices of the sixth inorganic film layer 43, the first optimization layer 44 and the second optimization layer 46 satisfy the above-mentioned relationship, the light transmittance of the sixth inorganic film layer 43, the first optimization layer 44 and the second optimization layer 46 can be effectively increased, the light transmittance of the display panel 100 can be further increased, and the power consumption of the display panel 100 can be improved.

Optionally, there are two combined structure layers. One of the combined structure layers is provided in the touch layer 40, where the first structure layer is the sixth inorganic film layer 43, the second structure layer is the second optimization layer 46, and the third structure layer is the optical adhesive layer 47. That is, the refractive indexes of the sixth inorganic film layer 43, the second optimization layer 46 and the optical adhesive layer 47 satisfy the above-mentioned relationship (4).

Another combined structure layer is provided in the touch layer 40, where the first structure layer is the sixth inorganic film layer 43, the second structure layer is the first optimization layer 44, and the third structure layer is the second optimization layer 46. That is, the refractive indices of the sixth inorganic film layer 43, the first optimization layer 44 and the second optimization layer 46 satisfy the above-mentioned relationship (5).

In some embodiments, there are a plurality of combined structure layers, where one of the combined structure layers may be provided in the encapsulation layer, namely, where the first structure layer in one combined structure layer is the organic film layer 33, the second structure layer is the second inorganic film layer 34, and the third structure layer is the third inorganic film layer 35. That is, the refractive indices of the organic film layer 33, the second inorganic film layer 34 and the third inorganic film layer 35 satisfy the above-mentioned formula (2).

At least part of another combined structure layer is positioned in the encapsulation layer 30, another part of the another combined structure layer is positioned on the touch layer 40. In the another combined structure layer, the first structure layer is the third inorganic film layer 35, the second structure layer is the fourth inorganic film layer 36, and the third structure layer is the fifth inorganic film layer 41. That is, the refractive index relationship between the third inorganic film layer 35, the fourth inorganic film layer 36 and the fifth inorganic film layer 41 satisfy the above-mentioned equation (3).

A further combined structure layer is provided in the touch layer 40, where the first structure layer is the sixth inorganic film layer 43, the second structure layer is the second optimization layer 46, and the third structure layer is the optical adhesive layer 47. That is, the refractive indexes of the sixth inorganic film layer 43, the second optimization layer 46 and the optical adhesive layer 47 satisfy the above-mentioned equation (4).

A yet further combined structure layer is provided in the touch layer 40, where the first structure layer is the sixth inorganic film layer 43, the second structure layer is the first optimization layer 44, and the third structure layer is the second optimization layer 46. That is, the refractive indices of the sixth inorganic film layer 43, the first optimization layer 44 and the second optimization layer 46 satisfy the above-mentioned equation (5).

In some embodiments, the refractive index of the second optimization layer 46 ranges from 1.65 to 1.75. Optionally, the refractive index of the second optimization layer 46 is 1.69. Optionally, the refractive index of the first optimization layer 44 ranges from 1.75 to 1.85. Optionally, the refractive index of the first optimization layer 44 is 1.79. For example, if the refractive index of the sixth inorganic film layer 43 is 1.9 and the refractive index of the optical adhesive layer 47 is 1.5, then the refractive index of the second optimization layer 46 may be 1.69 and the refractive index of the first optimization layer 44 may be 1.79.

The fifth inorganic film layer 41 and the sixth inorganic film layer 43 are, for example, silicon-nitride layers. The first optimization layer 44 and the second optimization layer 46 are, for example, inorganic material layers, so that the first optimization layer 44 and the second optimization layer 46 can be formed by a same process as the sixth inorganic film layer 43. For example, the sixth inorganic film layer 43 is formed by chemical deposition, the first optimization layer 44 is an inorganic material layer, and the first optimization layer 44 can also be formed by chemical deposition. In the forming process of the display panel 100, after the formation of the sixth inorganic film layer 43 is completed, the first optimization layer 44 can be formed by changing the parameters of the chemical deposition without moving the chemical deposition apparatus. Therefore, the forming process of the display panel 100 can be simplified and the forming efficiency of the display panel 100 can be improved.

In some embodiments, when the refractive indices of the fifth inorganic film layer 41 and the sixth inorganic film layer 43 are different, a third optimization layer may be provided between the fifth inorganic film layer 41 and the sixth inorganic film layer 43. The refractive index of the third optimization layer is between those of the fifth inorganic film layer 41 and the sixth inorganic film layer 43, so that the power consumption of the display panel 100 can be further improved and the display effect of the display panel 100 can be improved.

In some embodiments, a cover plate is provided on optical adhesive layer 47, for example.

In some embodiments, the first optimization layer 44 has a thickness, for example, ranging from 80 nm to 100 nm, for example, the first optimization layer 44 has a thickness of 90 nm.

In some optional embodiments, the second optimization layer 46 has a thickness, for example, ranging from 80 nm to 100 nm, for example, the second optimization layer 46 has a thickness of 90 nm.

The embodiments of the present application further provide a display apparatus that may include the display panel 100 according to any of the embodiments described above. Since the display apparatus according to the embodiments of the present application includes the above-described display panel 100, the display apparatus according to the embodiments of the present application has the advantageous effects of the above-described display panel 100, and will not be described in detail herein.

As with the embodiments described herein, these embodiments are not intended to be exhaustive or to limit the application to only the specific embodiments described. Obviously, many modifications and variations are possible in light of the above teaching. The embodiments were chosen and described in order to best explain the principles of the invention and its practical application to thereby enable others skilled in the art to best utilize the invention and various embodiments with various modifications as are suited to the particular use contemplated. This application is limited only by the claims and the full scope and equivalents thereof.

What is claimed is:

1. A display panel comprising:
a substrate;
a light-emitting element, disposed on the substrate;
an encapsulation layer, disposed on a side of the light-emitting element away from the substrate, wherein the encapsulation layer comprises a first inorganic film layer, a first auxiliary film layer and an organic film layer that are stacked on the light-emitting element, an absolute value of a difference between a refractive index of the first inorganic film layer and a refractive index of the first auxiliary film layer is less than or equal to 0.05, and an extinction coefficient of the first auxiliary film layer for visible light is less than an extinction coefficient of the first inorganic film layer for visible light.

2. The display panel according to claim 1, wherein the refractive index of the first auxiliary film layer ranges from 1.7 to 1.8.

3. The display panel according to claim 2, wherein the refractive index of the first auxiliary film layer is equal to the refractive index of the first inorganic film layer.

4. The display panel according to claim 2, wherein the refractive index of the first auxiliary film layer and the refractive index of the first inorganic film layer are both 1.75.

5. The display panel according to claim 1, wherein the extinction coefficient of the first inorganic film layer for visible light ranges from 0.0006 to 0.0110, and the extinction coefficient of the first auxiliary film layer for visible light ranges from 0.00002 to 0.0010.

6. The display panel according to claim 5, wherein an extinction coefficient of the first inorganic film layer for red light ranges from 0.0006 to 0.0018, and an extinction coefficient of the first auxiliary film layer for red light ranges from 0.00002 to 0.00006; and/or
an extinction coefficient of the first inorganic film layer for green light ranges from 0.002 to 0.0037, and an extinction coefficient of the first auxiliary film layer for green light ranges from 0.00003 to 0.00008.

7. The display panel according to claim 5, wherein an extinction coefficient of the first inorganic film layer for blue light ranges from 0.0039 to 0.0059, and an extinction coefficient of the first auxiliary film layer for blue light ranges from 0.002 to 0.001.

8. The display panel according to claim 1, wherein the first auxiliary film layer is an organic material-made auxiliary film layer.

9. The display panel according to claim 8, wherein the first auxiliary film layer has a thickness ranging from 1 μm to 10 μm.

10. The display panel according to claim 1, wherein the first auxiliary film layer is a nanoparticle layer comprising a plurality of nanoparticles and the nanoparticles have a diameter d ranging from 0.1 μm to 10 μm.

11. The display panel according to claim 10, wherein in a thickness direction of the display panel, an area of orthographic projections of the plurality of nanoparticles in the nanoparticle layer is greater than or equal to 50% of an area of an orthographic projection of the first inorganic film layer.

12. The display panel according to claim 10, wherein the plurality of the nanoparticles are uniformly distributed on the first inorganic film layer.

13. The display panel according to claim 10, wherein the nanoparticle layer have a thickness less than or equal to 2d.

14. The display panel according to claim 1, further comprising a combined structure layer on a side of the first auxiliary film layer away from the first inorganic film layer, the combined structure layer comprising a first structure layer, a second structure layer and a third structure layer that are stacked in a light extraction direction, and refractive indices of the first structure layer, the second structure layer and the third structure layer satisfying the following equation:

$$n_2 = \sqrt{n_1 \times n_3}$$

wherein $n_1$ is a refractive index of the first structure layer, $n_2$ is a refractive index of the second structure layer, and $n_3$ is a refractive index of the third structure layer.

15. The display panel according to claim 14, wherein the encapsulation layer further comprises a second inorganic film layer, a third inorganic film layer and a fourth inorganic film layer on a side of the organic film layer away from the first auxiliary film layer;
the display panel further comprises a touch layer comprising a fifth inorganic film layer, a metal layer and an optical adhesive layer that are stacked on a side of the encapsulation layer away from the light-emitting element; and
the first structure layer is the organic film layer, the second structure layer is the second inorganic film layer, and the third structure layer is the third inorganic film layer; or
the first structure layer is the third inorganic film layer, the second structure layer is the fourth inorganic film layer, and the third structure layer is the fifth inorganic film layer.

16. The display panel according to claim 15, wherein a refractive index of the fourth inorganic film layer is greater than a refractive index of the third inorganic film layer, and the refractive index of the fourth inorganic film layer is less than a refractive index of the fifth inorganic film layer.

17. The display panel according to claim 15, wherein the metal layer comprises a first metal layer and a second metal layer, a sixth inorganic film layer is arranged between the first metal layer and the second metal layer, and an optimization layer is arranged between the sixth inorganic film layer and the optical adhesive layer, and a refractive index of the optimization layer is less than a refractive index of the sixth inorganic film layer and greater than a refractive index of the optical adhesive layer.

18. The display panel according to claim 17, wherein the optimization layer comprises a first optimization layer and a second optimization layer, the first optimization layer is disposed between the sixth inorganic film layer and the second metal layer, the second optimization layer is disposed between the second metal layer and the optical adhesive layer, a refractive index of the first optimization layer is less than the refractive index of the sixth inorganic film layer and greater than a refractive index of the second optimization layer, and the refractive index of the second optimization layer is greater than the refractive index of the optical adhesive layer.

19. The display panel according to claim 18, wherein the combined structure layer is arranged in the touch layer, and the first structure layer is the sixth inorganic film layer, the second structure layer is the second optimization layer, and the third structure layer is the optical adhesive layer; or the combined structure layer is arranged in the touch layer, the first structure layer is the sixth inorganic film layer, the second structure layer is the first optimization layer, and the third structure layer is the second optimization layer.

20. A display apparatus comprising a display panel according to claim 1.

\* \* \* \* \*